United States Patent [19]

Stewart

[11] Patent Number: 4,748,426
[45] Date of Patent: May 31, 1988

[54] ACTIVE TERMINATION CIRCUIT FOR COMPUTER INTERFACE USE

[75] Inventor: Alexander Stewart, Boca Raton, Fla.

[73] Assignee: Rodime PLC, Glenrothes, Scotland

[21] Appl. No.: 927,989

[22] Filed: Nov. 7, 1986

[51] Int. Cl.[4] .......................................... H03H 11/28
[52] U.S. Cl. .................................. 333/22 R; 307/443
[58] Field of Search ...................... 333/22 R, 103, 104, 333/262; 307/443, 456

[56] References Cited

U.S. PATENT DOCUMENTS

| | | |
|---|---|---|
| 3,237,164 | 2/1966 | Evans . |
| 3,715,725 | 2/1973 | Kievit et al. . |
| 3,803,554 | 4/1974 | Bock et al. . |
| 4,015,147 | 3/1977 | Davidson et al. ............ 333/22 R X |
| 4,175,238 | 11/1979 | Breimesser et al. . |
| 4,206,443 | 6/1980 | Britton . |
| 4,228,369 | 10/1980 | Anantha et al. .............. 333/22 R X |
| 4,267,538 | 5/1981 | Assal et al. .......................... 333/262 |
| 4,426,697 | 1/1984 | Peterson et al. . |
| 4,454,509 | 6/1984 | Buennagel et al. . |
| 4,471,232 | 9/1984 | Peddie et al. . |
| 4,675,551 | 6/1987 | Stevenson et al. ................... 307/443 |

OTHER PUBLICATIONS

Palmieri et al., *Nonlinear Termination Network For a Transmission Line Semiconductor Circuit*, IBM Tech. Discl., Vol. 12, No. 11, Apr. '70, p. 1762.

Barish, *Active Terminator*, IBM Technical Disclosure Bulletin, vol. 17, No. 7, Dec. 1974, p. 1960.

*Primary Examiner*—Paul Gensler

[57] ABSTRACT

An active termination circuit for a computer interface for reducing line reflection of logic signals. A first and second resistor combination is permanently connected to a cable that couples a plurality of peripheral devices to one another. The other ends of the first and second resistors are connected through a switching device to a positive voltage supply line and to logic ground, respectively. That switching device may be a transistor. When termination of multiple devices is required, a plurality of resistor combinations is provided but on/off control of the switch is achieved by one control that is located remote from the termination circuit.

6 Claims, 1 Drawing Sheet

ACTIVE TERMINATION CIRCUIT FOR COMPUTER INTERFACE USE

BACKGROUND

The present invention relates to a device for terminating logic signals to peripheral devices from a computer or controller and more particularly for terminating logic signals to a plurality of peripheral devices from a computer or controller wherein there is minimal line reflection.

Peripheral devices connected to a computer may include paper tape, keyboards, disk drives, display devices, and output printers. The interface between the computer and the peripheral device is generally characterized by a multi-way cable carrying high speed logic signals. The most critical signals are transmitted via dedicated differential lines with an appropriate termination impedance. The less critical control signals are often transmitted on a transmission line which may be multiplexed between several peripheral devices connected by a connecting cable. The selection of an individual peripheral device is accomplished by means of a coded signal transmitted on one or more control lines.

It is necessary to provide a terminating impedance on each such line which matches the characteristic impedance of the connecting cable used, in order to avoid line reflection. This termination is generally provided by means of a 330 ohm resistor connected to a logic ground and a 220 ohm resistor connected to the control or transmission line. That provides an effective impedance of 132 ohms, which closely matches the characteristic impedance of the commonly-used twisted-pair or flat-ribbon connecting cable and provides a dc bias appropriate to the matching characteristics of the transmitting and receiving devices.

In a system where only one peripheral device is connected to the transmission line, that peripheral device must also have such a termination network in order to avoid line reflection problems. Where a multiplicity of peripheral devices are connected to the same transmission line, then only one of the peripheral devices need have a termination network. The effect of paralleling several termination networks would reduce the effective terminating impedance to an incorrect value and would place an excessive load on the logic drive element.

In most present disk drive designs, a termination having a socket connected to each line to be terminated is used. Into the socket may be plugged the common point of the 220 ohm, 330 ohm resistor combination whose other ends are connected through the socket to ground and to an appropriate power supply voltage, respectively. To connect the termination network to a particular peripheral device, an appropriate resistor array is plugged into such socket. If no termination network is required, the resistor array is omitted. In practice, this is provided by using a single in-line or dual in-line resistor array and a matching socket.

In many peripheral device designs however, for example, in some disk drive designs, space or other considerations demand that access to the printed circuit board containing the termination package be restricted. The circuit board, for example, may be mounted with the components facing away from the outside toward some other part of the disk drive structure. In such circumstances, it is thus necessary to remove or to partially dismantle the disk drive in order to gain access to the termination network. Some disk drive designs have attempted to resolve this problem by utilizing an angled socket so that, using appropriate tools, such as needle nose pliers, a termination package may be removed or inserted from the exposed edge of the board.

SUMMARY OF THE INVENTION

In view of the foregoing, it should be apparent that there still exists a need in the art for a termination circuit to minimize line reflections of logic signals sent to a plurality of peripherals that can be controlled remotely from the termination network.

It is therefore, an object of the present invention to provide an active termination circuit for logic signals from a computer or controller to a plurality of peripheral devices connected to one another by a connecting cable without producing line reflections.

It is another object of the present invention to provide one active termination circuit for logic signals sent from a computer or controller to a plurality of peripheral devices connected to one another by a connecting cable without producing line reflection, wherein a control for connecting and disconnecting the termination network is located remotely from the termination network.

These and other objects of the invention may be achieved by an active termination circuit comprising a connecting cable for coupling a plurality of peripheral devices; a switch for selectively connecting and disconnecting the connecting cable with a logic transmission line; and a circuit connected to the coupling means for eliminating line reflection of the logic signal.

DESCRIPTION OF THE PREFERRED EMBODIMENT

Figure 1:
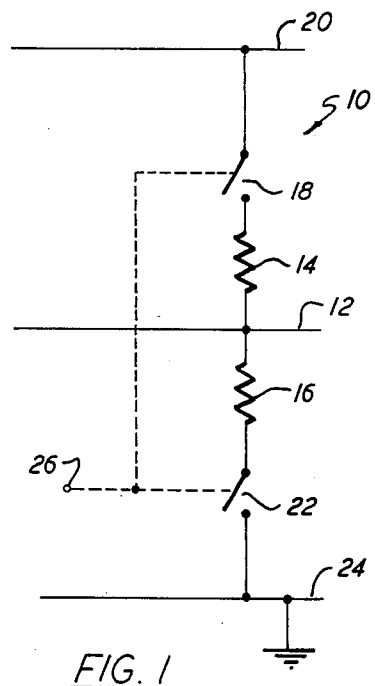
FIG. 1 is a circuit diagram of a preferred embodiment of the active termination circuit of the present invention for computer interface use.

FIG. 1 is a circuit diagram of the active termination circuit 10 of the present invention for use with a computer interface. The connecting cable 12, which couples a plurality of peripheral devices to one another, is coupled to the common point of the resistors 14 and 16. The resistor 14 is coupled through a switch 18 to the positive voltage supply 20. The resistor 16 is coupled through a switch 22 to the logic ground 24. A control 26 controls the operation of the switch 22 and the switch 18. Control 26 is manually operated so that the termination circuit is put in place when desired. The resistance values of the resistors 14 and 16 are chosen such that the terminating impedance matches the characteristic impedance of cable 12. In the preferred embodiment, the resistor 14 is a 220 ohm resistor and the resistor 16 is a 330 ohm resistor. This provides an effective impedance of 132 ohms which closely matches the characteristic impedance of the commonly used twisted-wire or flat-ribbon connecting cable.

Figure 2:
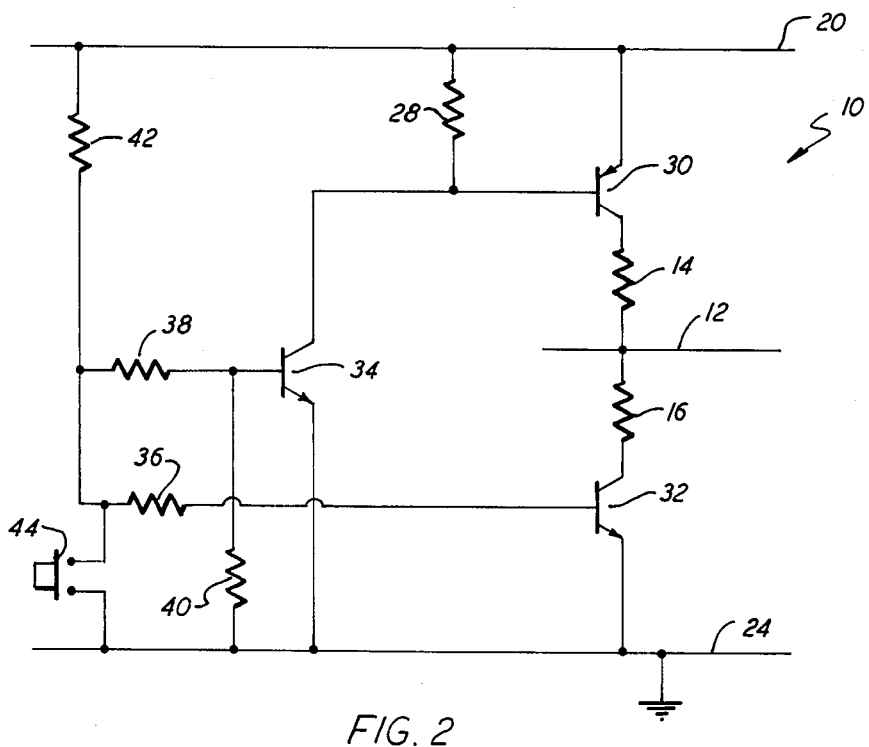
FIG. 2 is a circuit diagram of an alternative embodiment of the active termination circuit for computer interface use of the present invention.

In an alternative embodiment depicted in FIG. 2, transistors are used as electronic switches in a circuit configuration and provide a dc bias of 2 v which is appropriate to the switching levels of TTL devices. The emitter of transistor 30 is coupled to the positive voltage supply 20 and its collector is coupled to the resistor 14. The emitter of the transistor 32 is coupled to the logic ground 24 and its collector is coupled to resistor 16. The bases of the transistors 30 and 32 are coupled to control circuitry 26.

Control circuitry 26 may be any suitable circuit configuration but, in the preferred embodiment, comprises a resistor 28 connected at one end to the base of transistor 30 and at its other end to the positive voltage supply 20. The base of transistor 30 is also connected to the collector of transistor 34. The emitter of transistor 34 is connected to logic ground 24. The base of transistor 32 is connected to one end of a resistor 36 and the base of transistor 34 is connected to one end of a resistor 38. The other ends of resistors 36 and 38 are connected at a common point. A resistor 42 is connected at one end to the positive voltage supply 20 and on the other end to the common point of resistors 38 and 36. A resistor 40 is connected on one end to the base of transistor 34 and on the other end to logic ground 24. Control 44 is connected between the common point of resistors 42, 38 and 36 and logic ground 24.

The control 44 is a link which has an open and a closed state. Control 44 may be of any suitable construction such as a push button that closes the link when depressed. When the control 44 is open, current is supplied to the base of the transistor 32. The transistor 32 saturates and holds the resistor 16 close to ground potential. Current is thus drawn from the base of the transistor 30. The transistor 30 is thus saturated, which holds the voltage across resistor 14 close to the voltage of the positive voltage supply 20. The resistors 14 and 16 are therefore connected from line 12 to supply 20 and ground 24 and thus termination is accomplished.

When the control 44 is closed, the base of transistor 32 is grounded. The transistor 32 is turned off and therefore there is a high impedance between resistor 16 and logic ground 24. Similarly, transistor 34 is turned off and no current is drawn from the base of transistor 30 so that it in effect is turned off, presenting a high impedance between resistor 14 and the positive supply 20. Resistors 14 and 16 are therefore both effectively disconnected and termination is not accomplished.

Figure 3:
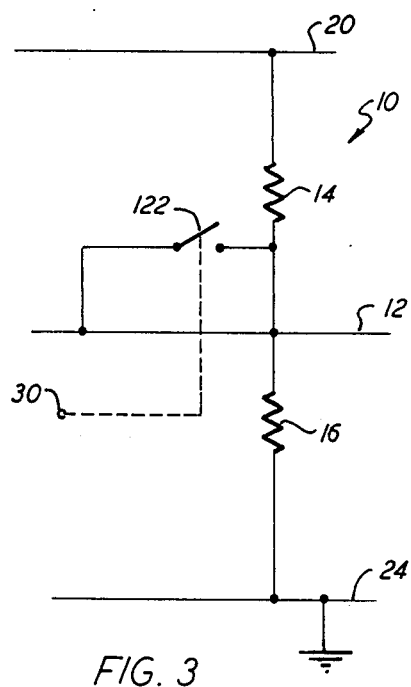
FIG. 3 is a circuit diagram of another alternative embodiment of the active termination circuit for computer interface use of the present invention.

FIG. 3 depicts another embodiment of the present invention in which the resistors 14 and 16 are coupled to the transmission line 12 and the logic ground 24 and a switch 122 is provided to connect and disconnect resistors 14 and 16 to the connecting cable 12. A control 30 is provided to manually control switch 122 thereby providing a remote means for connecting and disconnecting the termination circuit. Several means will also be apparent for implementing control switch 122, such as ganged mechanical switches, electromechanical relays or electronic switching devices.

Implementation of the termination circuit 10 may be made in several ways. Either discrete circuit components or intergrated circuit technology may be used. The integrated circuit technology may take the form of a circuit designed specifically for this purpose or a standard intergrated circuit which contains at least an appropriate number of necessary circuit elements and which has those elements connected together by means of a metalization pattern to generate the appropriate functions for the complete circuit. Both methods provide a cost effective solution.

As is depicted in FIG. 2, any number of peripheral devices may be terminated using the active termination invention disclosed herein by provision of sufficient resistor switch channels.

The present invention may be embodied in other specific forms without departing from the spirit or essential characteristics thereof. The embodiments presented are illustrative and not restrictive with the scope of the invention being indicated by the attached claims rather than the foregoing description. All changes, within the meaning and range of equivalence of the claims are therefore intended to be embraced therein.

What is claimed is:

1. In a system in which a logic generator transmits a data to a plurality of peripheral devices through a connecting cable, an active termination circuit to minimize line reflection of the transmitted signal, comprising:
   means for providing a voltage;
   means connected between said voltage providing means and said cable and a logic ground potential for minimizing line reflection;
   means for selectively connecting and disconnecting said minimizing means to the cable;
   said minimizing means comprising first and second resistor means commonly connected at one end to said cable, said first resistor means being connected at its other end to the voltage providing means and said second resistor means being connected at its other end to a logic ground potential; and
   the connecting and disconnecting means comprises switch means disposed between the common connection of said first and second resistor means and the connecting cable and means to control said switch means disposed remotely from said switch means.

2. A termination circuit as recited in claim 1, wherein said first resistor means comprises a 220 ohm resistor and said second resistor means comprises a 330 ohm resistor.

3. In a system wherein a logic generator communicates with a plurality of peripheral devices through a connecting cable, an active termination circuit to minimize line reflection of the data signal, comprising:
   means for providing a voltage;
   means connected to the cable for minimizing line reflection, said minimizing means having first and second ends;
   means for selectively connecting and disconnecting the minimizing means from the voltage providing means at said first end and a logic ground potential at said second end;
   said minimizing means comprising first and second resistor means connected to one another in series when the minimizing means is connected to the cable;
   said connecting and disconnecting means comprising:
   first switch means connected between the first resistor means and the voltage providing means;
   second switch means connected between the second resistor means and logic ground; and
   control means disposed remote to the first and second switch means for controlling said first and second switch means; and
   said first switch means is a first transistor having its emitter connected to the voltage providing means, its collector connected to the first resistor means and its base connected to the control means and the second switch means is a second transistor having its emitter connected to logic ground, its collector connected to the second resistor means and its base connected to the control means.

4. A termination circuit as recited in claim 3, wherein said control means comprises:
  a link, having an open position and a closed position; and
  circuit means connected to the link to saturate the first and second transistors when the link is open and to turn the first and second transistors off when the link is closed.

5. A termination circuit as recited in claim 4, wherein the resistance of the first resistor means is 220 ohms and the resistance of the second resistor means is 330 ohms.

6. A termination circuit as recited in claim 5, wherein the first transistor is a PNP transistor and the second transistor is an NPN transistor.

* * * * *

UNITED STATES PATENT AND TRADEMARK OFFICE
CERTIFICATE OF CORRECTION

PATENT NO. : 4,748,426

DATED : May 31, 1988

INVENTOR(S) : Alexander STEWART

It is certified that error appears in the above-identified patent and that said Letters Patent is hereby corrected as shown below:

Column     Line 4     8     Delete "with" and replace with --within--.

4     14     Delete "a", third occurrence.

Signed and Sealed this

Sixth Day of September, 1988

Attest:

DONALD J. QUIGG

Attesting Officer     Commissioner of Patents and Trademarks